United States Patent
Carl

(10) Patent No.: US 10,132,892 B2
(45) Date of Patent: Nov. 20, 2018

(54) METHOD AND APPARATUS FOR SLAB SELECTION IN ULTRASHORT ECHO TIME 3-D MRI

(71) Applicant: GENERAL ELECTRIC COMPANY, Schenectady, NY (US)

(72) Inventor: Michael Carl, San Diego, CA (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 1036 days.

(21) Appl. No.: 14/317,605

(22) Filed: Jun. 27, 2014

(65) Prior Publication Data

US 2015/0377996 A1 Dec. 31, 2015

(51) Int. Cl.
*G01V 3/00* (2006.01)
*G01R 33/48* (2006.01)
*G01R 33/483* (2006.01)

(52) U.S. Cl.
CPC ..... *G01R 33/4816* (2013.01); *G01R 33/4826* (2013.01); *G01R 33/4833* (2013.01)

(58) Field of Classification Search
CPC .................................................. G01R 33/4816
USPC ...................................... 324/307, 306, 309
See application file for complete search history.

(56) References Cited

U.S. PATENT DOCUMENTS

| | | | |
|---|---|---|---|
| 6,968,225 B2* | 11/2005 | Vu | G01R 33/482 |
| | | | 324/309 |
| 7,047,062 B2* | 5/2006 | Licato | G01R 33/561 |
| | | | 324/306 |
| 7,301,341 B2* | 11/2007 | Hargreaves | G01R 33/561 |
| | | | 324/307 |
| 7,548,062 B1 | 6/2009 | Gurney | |
| 8,698,496 B2* | 4/2014 | Sorensen | G01R 33/4633 |
| | | | 324/307 |
| 9,341,691 B2* | 5/2016 | Park | G01R 33/4641 |

OTHER PUBLICATIONS

Yongxian Qian, et al; Acquisition-Weighted Stack of Spirals for Fast High-Resolution Three-Dimensional Ultra-short Echo Time MR Imaging; Magnetic Resonance in Medicine (2008).
Paul Gurney, et al; Design and Analysis of a Practical 3D Cones Trajectory; Magnetic Resonance in Medicine (2006).
Brian Harvreaves, et al; Variable-Rate Selective Excitation for Rapid MRI Sequences; Magnetic Resonance in Medicine(2004).
Fernando Boada, et al; Fast Three Dimensional Sodium Imaging; MR Research Center (1997).
Jurgen Rahmer; Three-Dimensional Radial Ultrashort Echo-Time Imaging with T2 Adapted Sampling; Magnetic Resonance in Medicine(2006).
Robson et al. "Magnetic Resonance: An Introduction to Ultrashort TE (UTE) Imaging", Lippincott Williams & Wilkins 2003, Comput Assist Tomogr, vol. 27, No. 6. 22 pages.

(Continued)

*Primary Examiner* — Louis Arana

(57) ABSTRACT

A method for slab selection in ultrashort echo time three-dimensional MRI includes applying an excitation signal to a target under a polarizing field; applying a unipolar slab selection gradient pulse to the target, concurrent with the excitation signal; and applying a rewinder pulse to the target for less than about 30 μs, immediately after the slab selection gradient pulse, and still under the polarizing field.

21 Claims, 10 Drawing Sheets

(56) References Cited

OTHER PUBLICATIONS

Pauly et al., "Slice-selective Excitation for very short T2 Species", In: Proceedings of the SMRM 8th Annual Meeting, Amsterdam, p. No. 28, 1989.
Scheffler et al., "Reduced Circular Field-of-View Imaging", Magnetic Resonance in Medicine, vol. No. 40, Issue No. 03, pp. 474-480, Sep. 1998.
Larson et al., "Anisotropic Field-of-Views in Radial Imaging", IEEE Trans Med Imaging, vol. No. 27, Issue No. 01, pp. 47-57, 2008.
Carl et al., "MR Imaging Near Metal With Undersampled 3D Radial UTE-MAVRIC Sequences", Magnetic Resonance in Medicine, vol. No. 69, pp. 27-36, 2013.

\* cited by examiner

METHOD AND APPARATUS FOR SLAB SELECTION IN ULTRASHORT ECHO TIME 3-D MRI

BACKGROUND

Technical Field

Embodiments of the invention relate generally to magnetic resonance imaging ("MRI"). Particular embodiments relate to acquisition of anisotropic three-dimensional magnetic resonance images with ultrashort echo times ("3DUTE MRI").

Discussion of Art

When a substance such as human tissue is subjected to a uniform magnetic field (a polarizing field B0), the individual magnetic moments of particle spins in the tissue attempt to align with this polarizing field, but precess about it in random order at their characteristic Larmor frequency. If the substance, or tissue, is subjected to an RF magnetic field (excitation field B1), which defines an x-y plane and varies at a frequency near a Larmor frequency corresponding to spins of selected particles, the net aligned moment, or "longitudinal magnetization" (M2) of those selected particles, may be rotated, or "tipped", into the x-y plane to produce a net transverse magnetic moment M. After the excitation signal B1 is terminated, the tipped spins "relax" back into the precession defined by the polarizing field, and by doing so, produce RF signals. The time from termination of the excitation signal B1, until initiation of another excitation signal B1, is known as an "echo time," during which the relaxation RF signals may be received and processed as k-space data from which an image may be formed. In order to form a pixelated image that a human doctor can interpret, gradient magnetic fields (Gx, Gy, Gz) are applied to localize the tissue response to the excitation signal B1. The gradient fields may be applied during, or after, the excitation signal B1.

For certain tissue types, e.g., musculoskeletal tissues, it is desirable to obtain an image with ultrashort echo times ("UTE"), on the order of less than 100 μs.

BRIEF DESCRIPTION

Aspects of the invention provide for slab selection in three-dimensional ultrashort echo time MRI ("3DUTE MRI") with minimal image artifacts.

In embodiments, a method is provided for slab selection in ultrashort echo time three-dimensional MRI. The inventive method includes applying an excitation signal to a target under a polarizing field; applying a unipolar slab selection gradient pulse to the target, concurrent with the excitation signal; and applying a rewinder pulse to the target for less than about 30 μs, immediately after the slab selection gradient pulse, and still under the polarizing field.

In other embodiments, an article of computer-readable media is encoded with an MRI image obtained by a process that includes applying an excitation signal to a target under a polarizing field; applying a unipolar slab selection gradient pulse to the target, concurrent with the excitation signal; and applying a rewinder pulse to the target for less than about 30 μs, immediately after the slab selection gradient pulse, and still under the polarizing field.

In other embodiments, an article of computer-readable media is encoded with an MRI image obtained by a process that includes applying an excitation signal to a target under a polarizing field; applying a unipolar slab selection gradient pulse to the target, concurrent with the excitation signal; and applying a rewinder pulse to the target for less than about 30 μs, immediately after the slab selection gradient pulse, and still under the polarizing field.

DRAWINGS

The present invention will be better understood from reading the following description of non-limiting embodiments, with reference to the attached drawings, wherein below:

DETAILED DESCRIPTION

Figure 1:
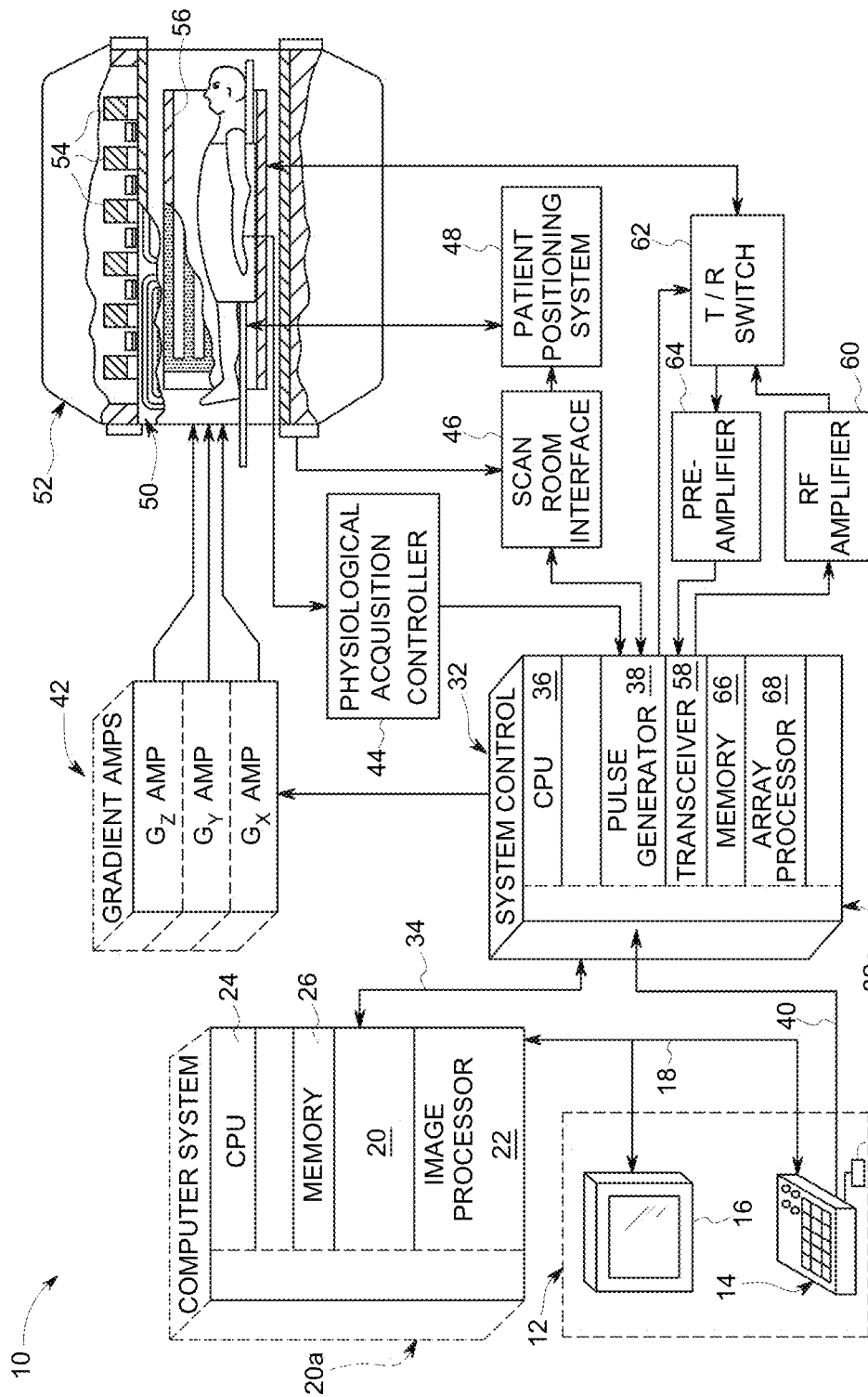
FIG. 1 shows schematically a magnetic resonance imaging system that incorporates a first embodiment of the invention.

Reference will be made below in detail to exemplary embodiments of the invention, examples of which are illustrated in the accompanying drawings. Wherever possible, the same reference characters used throughout the drawings refer to the same or like parts, without duplicative description.

Aspects of the invention relate to three-dimensional ultrashort echo time ("3DUTE") magnetic resonance imaging ("MRI").

FIG. 1 shows major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate system control 32 through a high speed signal link 34. The computer system 20 and the system control 32 collectively form an "MRI controller" 33. According to embodiments and aspects of the invention, the MRI controller 33 is configured to accomplish 3-D multispectral MRI with enhanced T1 contrast, according to algorithms further discussed below.

The system control 32 includes a set of modules connected together by a backplane 32a. These include a CPU module 36 as well as a pulse generator module 38, which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to several components that are operated by the MRI controller 33, including a set of gradient amplifiers 42, a physiological acquisition controller 44, and a scan room interface circuit 46. The pulse generator module 38 operates the gradient amplifiers 42 to achieve desired timing and shape of the gradient pulses that are produced during the scan. The pulse generator module 38 receives patient data from the physiological acquisition controller 44, which receives signals from a number of different sensors connected to the patient, such as ECG signals from electrodes attached to the patient. And finally, the pulse generator module 38 receives from the scan room interface circuit 46, signals from various sensors associated with the condition of the patient and the magnet system. It is also through the scan room interface circuit 46 that the MRI controller 33 commands a patient positioning system 48 to move the patient or client C to a desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 and a whole-body RF coil 56. In an embodiment of the invention, RF coil 56 is a multi-channel coil. A transceiver module 58 in the system control 32 produces pulses that are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit mode or receive mode. The MR signals picked up by the multi-channel RF coil 56 are digitized by the transceiver module 58 and are transferred to a memory module 66, or other computer readable media, via the system control 32.

"Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory 66. In response to commands received from the operator console 12, this image data may be archived in long term storage within the memory 66, and/or it may be further processed by the image processor 22 and conveyed to the operator console 12 and presented on the display 16. The image data also may be transferred from the memory 66 to other computer readable media that is removable from the MRI system 10.

Figure 2:
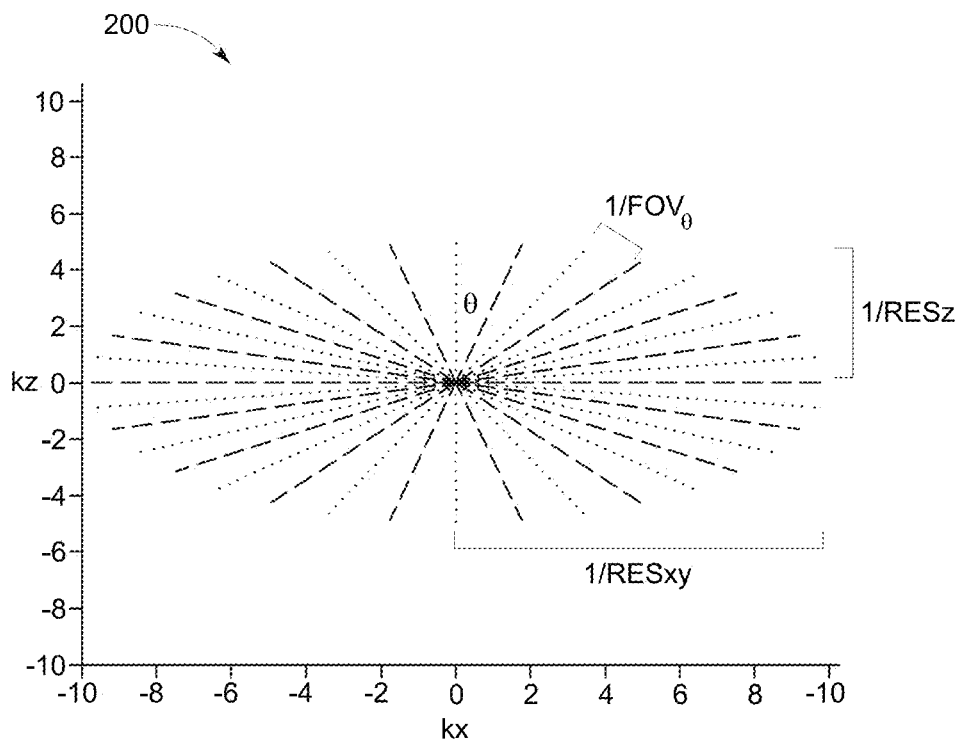
FIG. 2 shows schematically k-space sampling surfaces for a 3DUTE protocol.
Figure 3:
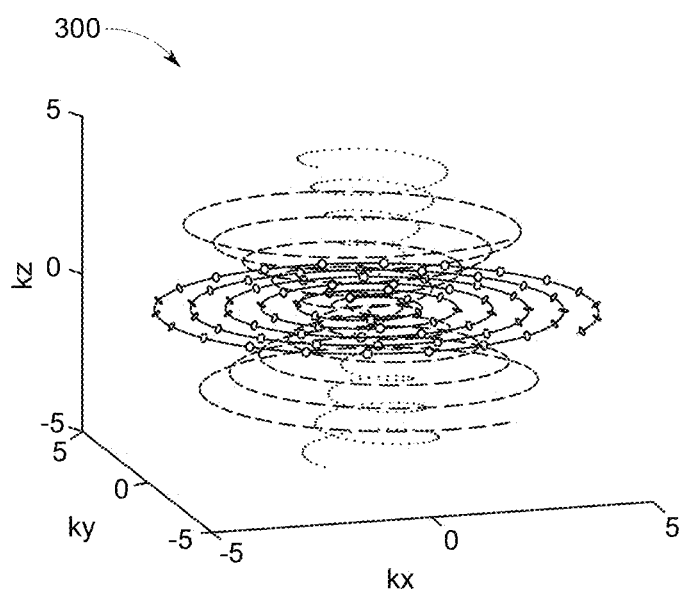
FIG. 3 shows schematically gradient trajectories for a 3DUTE protocol to produce the sampling surfaces shown in FIG. 2.

FIG. 2 shows schematically k-space surfaces 200 that are sampled by a 3DUTE protocol that uses the k-space sampling trajectories 300 shown in FIG. 3. Utilizing MRI to image tissues with short T2 response, e.g., tissues frequently encountered in the musculoskeletal system, requires specialized pulse sequences with very short echo times (TE) on the order of tens of microseconds. A common feature of many ultrashort TE (UTE) sequences is that data acquisition is started as soon as possible after the RF excitation (limited by the transmit-to-receive, "T/R", switching time), and k-space data is acquired in a center-out fashion. FIGS. 2 and 3 exemplify center-out acquisition, which can provide high data collection efficiency per unit time at the expense of sensitivity to dephasing during the data acquisition readout.

Figure 4:
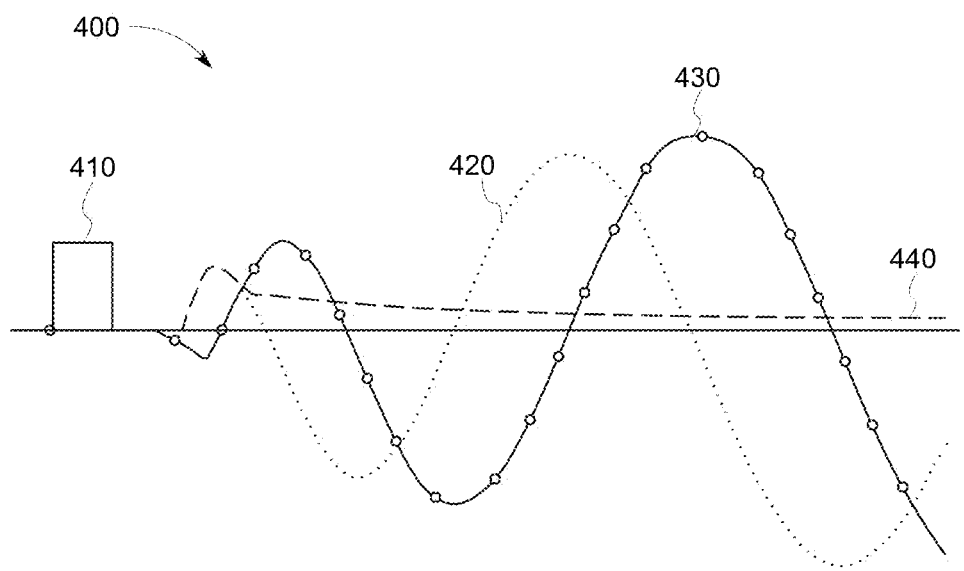
FIG. 4 shows graphically an excitation pulse and gradient pulses corresponding to FIGS. 2 and 3.

FIG. 4 shows schematically a gradient echo imaging scan 400, corresponding to FIGS. 2 and 3, which combines an excitation pulse 410 with gradient pulses 420, 430, 440. The scan 400 is planned as follows: First, a volume of k-space that encodes the desired imaging resolution is determined, and this volume is divided into a number of polar angles (determined by the desired field-of-view), which define the conical k-space sampling surfaces 200 shown by FIG. 2. Then, k-space trajectories 300, as shown in FIG. 3, are calculated to cover the sampling surfaces 200 with uniform sampling density. The gradient pulses 420, 430, 440 then are determined and applied to the target to sample the outward spiraling k-space trajectories 300.

Figure 5:
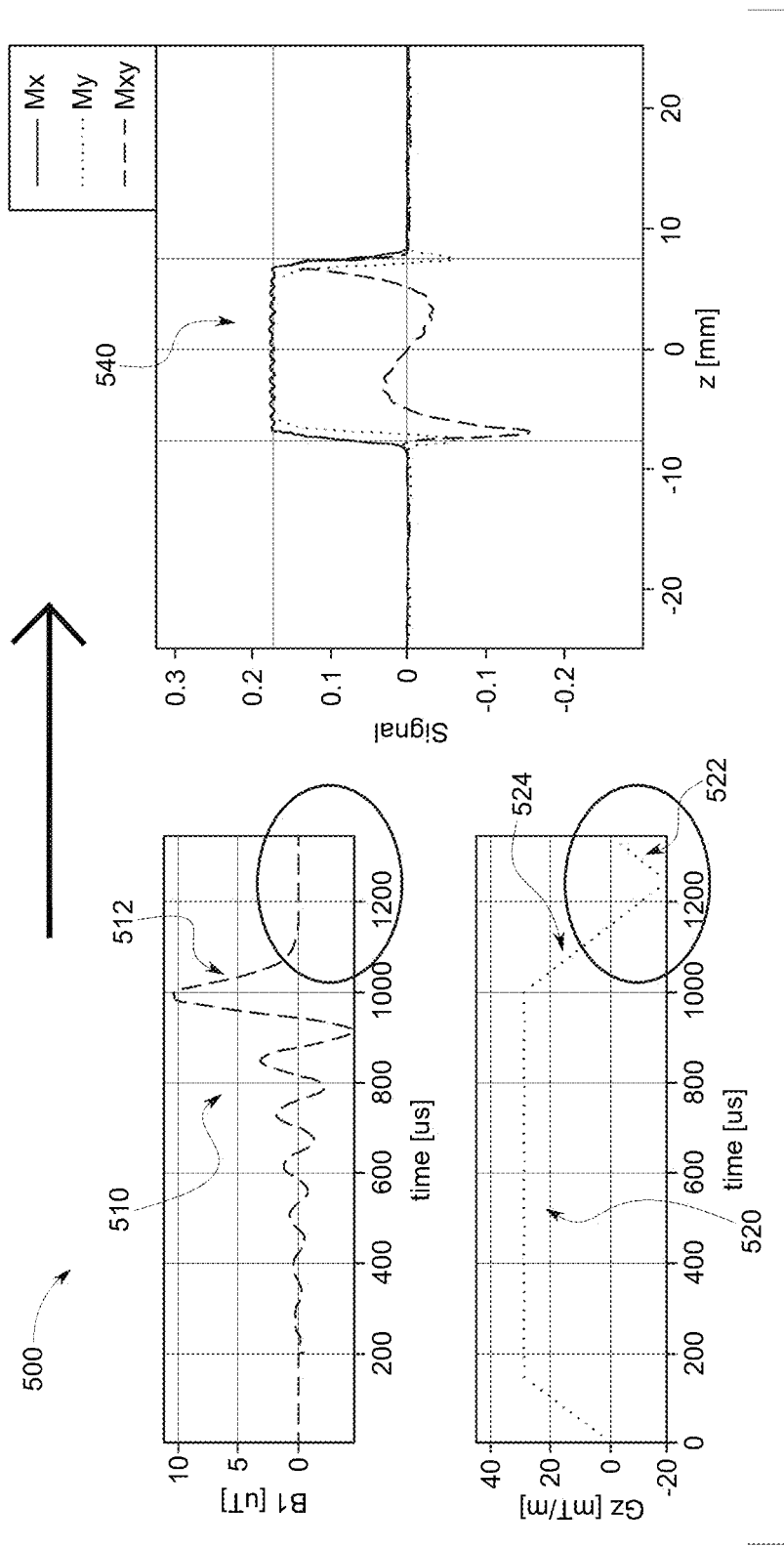
FIG. 5 shows schematically a scan combining a VERSE-corrected SLR excitation pulse and a slab-selection gradient pulse with rewinder.

FIG. 5 shows schematically a scan 500 combining a VERSE-corrected SLR excitation pulse 510 and a slab-selection gradient pulse 520 with rewinder 522. The VERSE-corrected SLR excitation pulse 510 concentrates most of its energy toward the end of the pulse, hence reducing the magnitude of the through-slice phase that requires rewinding. Therefore the rewinder 522 can be reduced. However, to obtain a TE less than about 300 μs using the scan 500, requires overlapping the final downslope 512 of the SLR pulse 510 onto the rampdown 524 of the slab-selection gradient pulse 520. This is problematic as it makes proper VERSE-correction of the excitation pulse 510 critical to maintaining k-space deposition during the slab-selection rampdown. Presuming the VERSE-correction works correctly, then TE on the order of about 100-300 μs can be reliably obtained with the scan 500, which produces a slab profile 540 with imaginary component Mx appropriately limited to the intended slab thickness.

As used herein, terms such as "substantially," "generally," "on the order of," and "about" indicate conditions within reasonably achievable manufacturing and assembly tolerances, relative to ideal desired conditions suitable for achieving the functional purpose of a component or assembly.

In order to achieve TE times on the order of tens of microseconds one needs to remove the rewinder gradient. For a 2D UTE scan 600, a VERSE-corrected half-sinc excitation pulse 610, as shown at lower left of FIG. 6, can be duplicated (NEX=2), using opposite polarity for the slab select gradient pulse 620 for the readout from the second excitation pulse. Then each readout will produce an imperfect slab profile 630, the two slab profiles 630a, 630b having opposite polarity as seen at top of FIG. 6 and having imaginary components Mx that extend far outside the intended thickness of the slab. When both slab profiles are added, the opposite imaginary components cancel to produce an acceptable slab profile 640, as shown at lower right of FIG. 6.

However, excessive scan durations discourage NEX=2 protocols for 3D MRI. In a single scan (NEX=1) that makes use of a conventional SLR excitation pulse, entirely removing the rewinder gradient typically will result in excessive phase across the slab, which causes artifacts in the final image.

Figure 7:
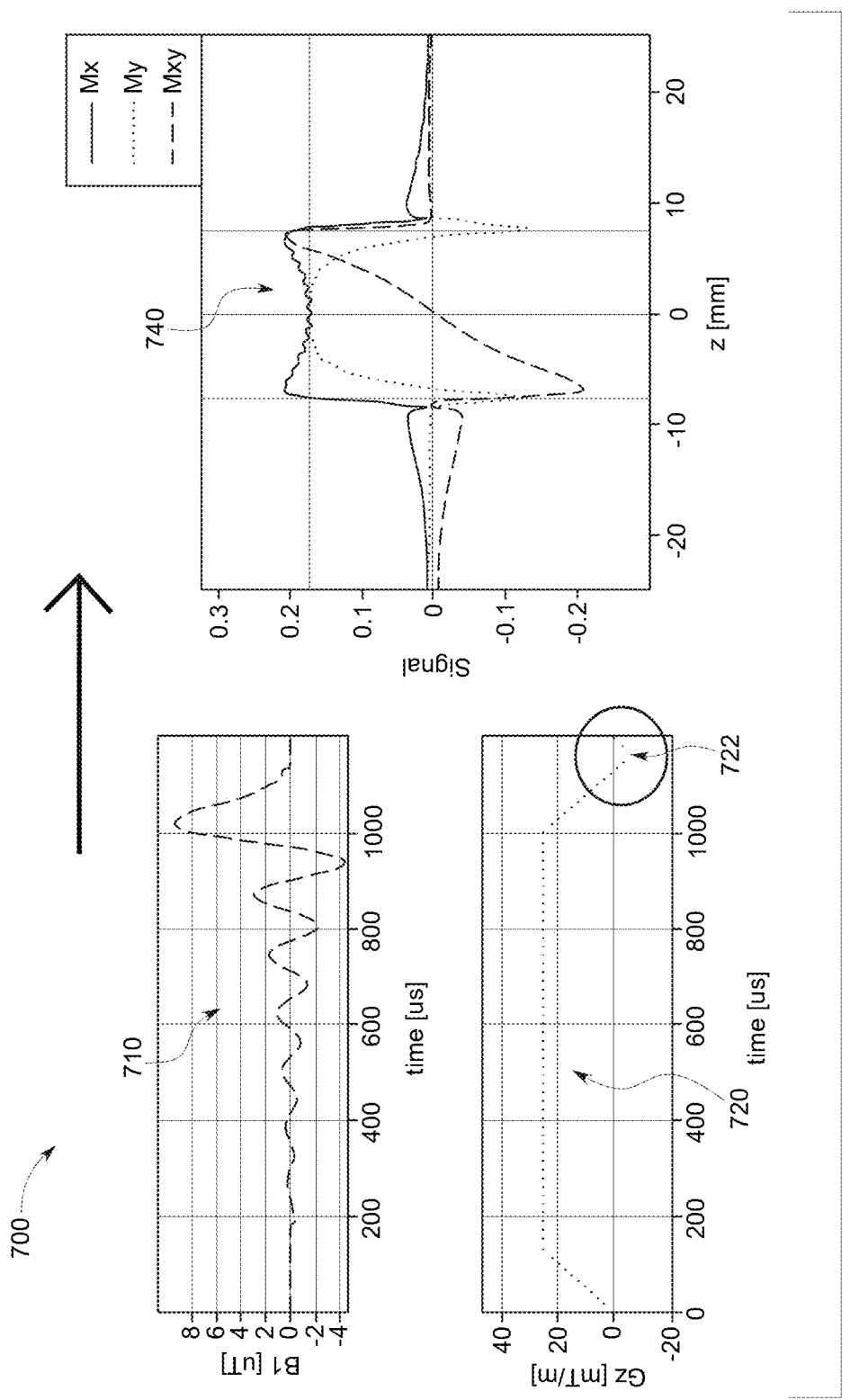
FIG. 7 shows schematically a scan combining an SLR excitation pulse with minor VERSE correction and a slab-selection gradient pulse with short rewinder, according to a first embodiment of the invention.

As an alternative, one can sacrifice some of the overall slice shape by undertaking a scan 700, as shown in FIG. 7. In the scan 700, an excitation pulse 710 is provided as an SLR pulse with reduced VERSE correction, and a slab-selection gradient pulse 720 is provided with a minimal rewinder gradient 722 of duration less or equal than the transmit/receive switching time of the MRI system 10 (e.g., less than about 30 μs). The rewinder gradient 722 is applied immediately after the slab-selection gradient pulse 720, and may be provided immediately after the end of the excitation pulse 710, or during the end of the excitation pulse 710. The scan 700 produces a slab profile 740 that is mostly in the real channel My, while a small out-of-slab portion of the imaginary signal Mx typically does not cause visible artifacts when the controller 33 produces a finished MRI image, which can be written back into the memory 66. Thus, the scan 700 advantageously presents a promising compromise of ultrashort TE on the order of tens of microseconds, with NEX=1 for scan time approaching one half what is required for NEX=2.

Figure 6:
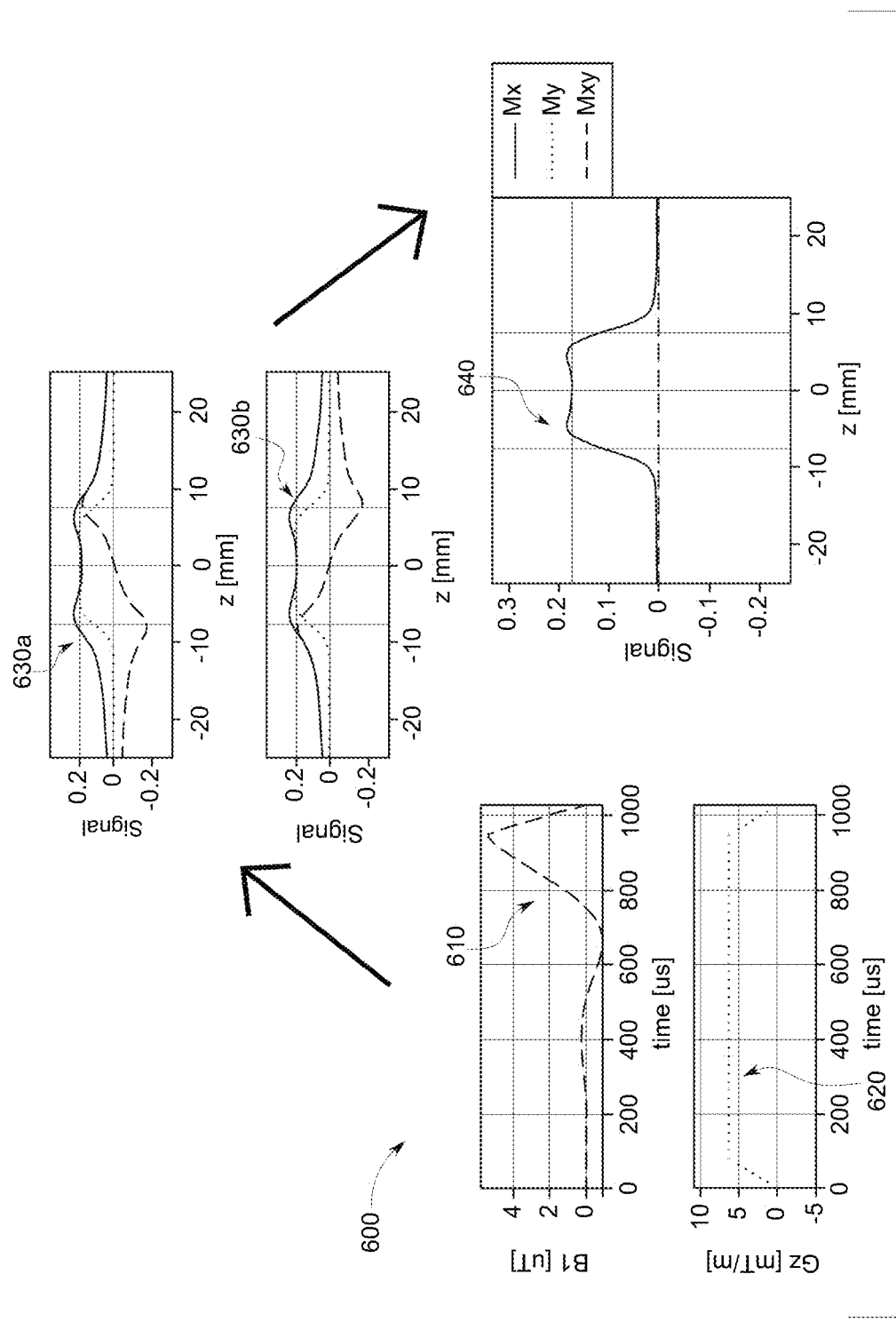
FIG. 6 shows schematically a scan combining a VERSE-corrected half-sinc excitation pulse and a slab-selection gradient pulse.
Figure 8A:
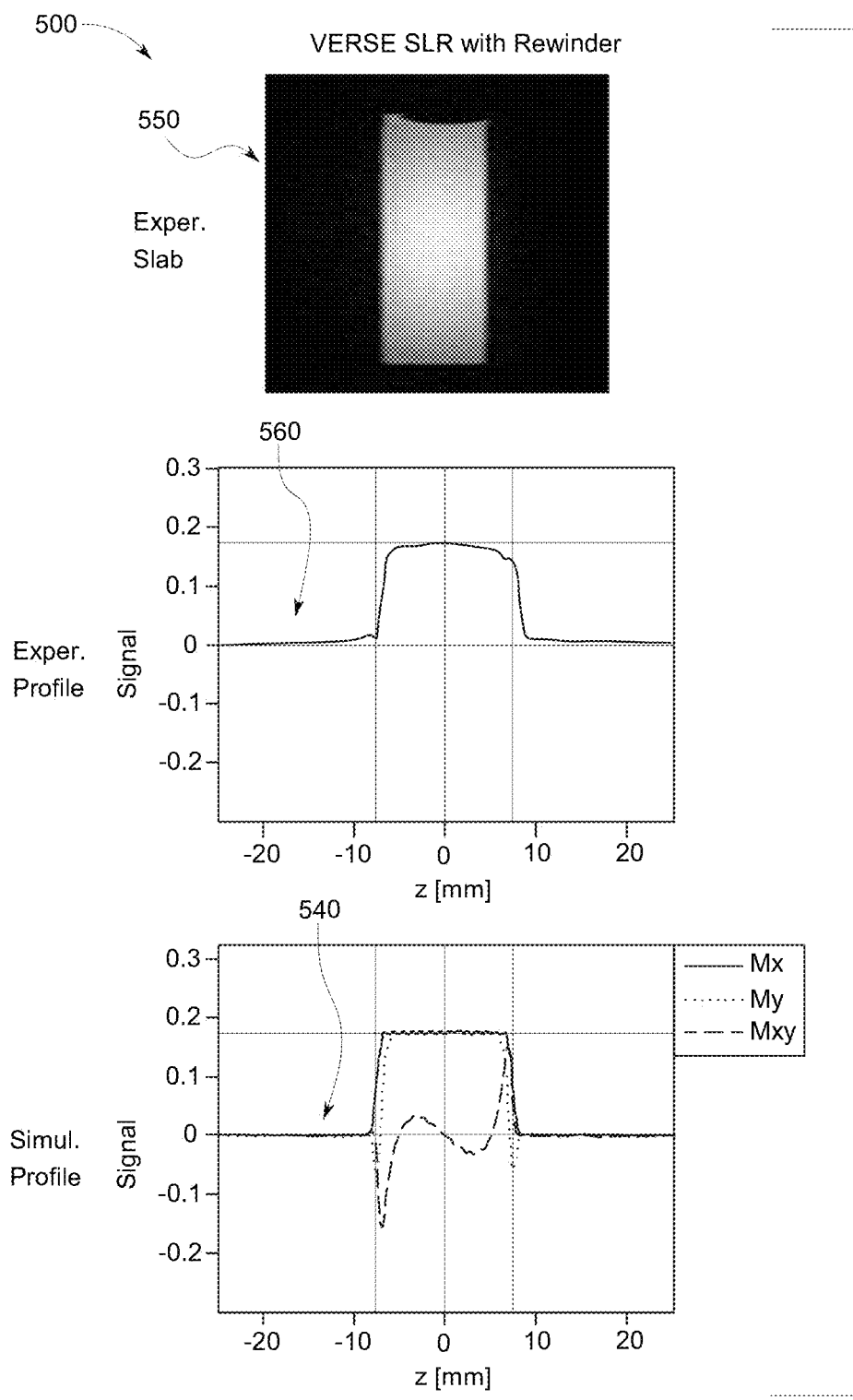
FIGS. 8A-8C show experimental and predicted results of the scan shown in FIG. 7.
Figure 8B:
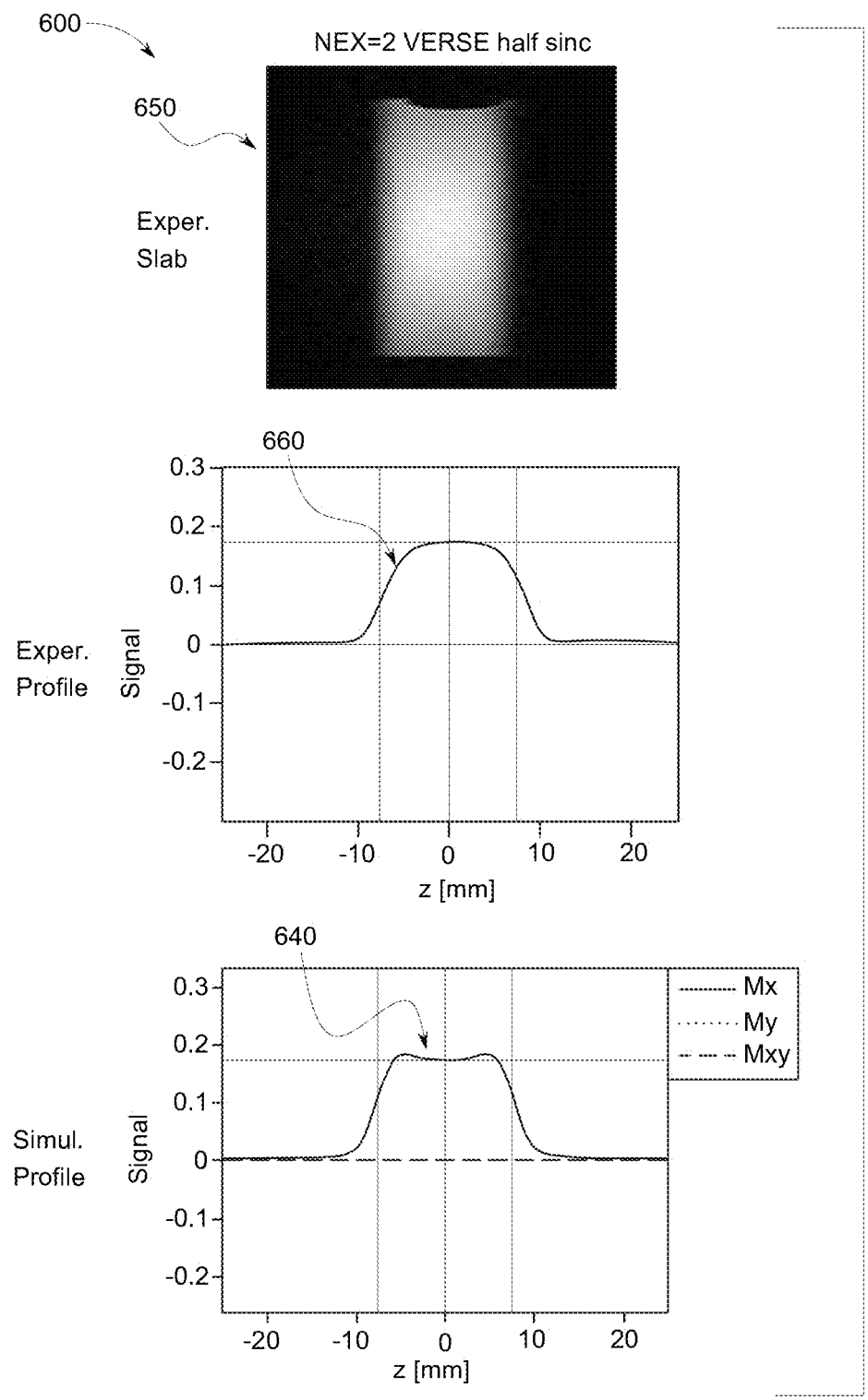
Figure 8C:
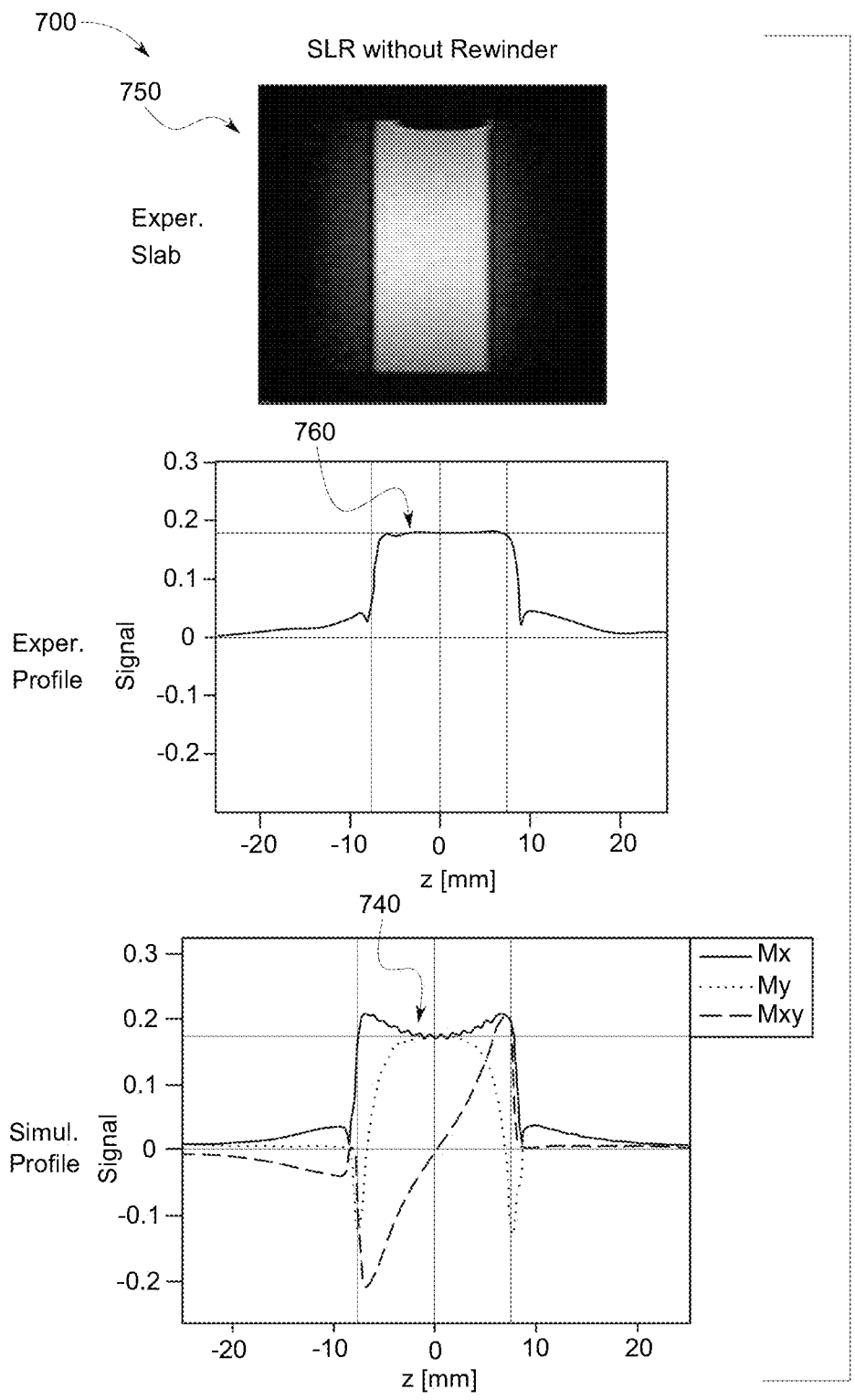

FIG. 8 shows images 550, 650, and 750 as well as predicted slab profiles 540, 640, and 740 and experimental slab profiles 560, 660, 760 as obtained from water bottle phantom tests that utilized the scans 500, 600, 700 as respectively shown in FIGS. 5, 6, and 7. It can be seen that the scan 700 provided an image 750 of acceptable quality, along with a clean-edged slab profile 740. The slab profiles were obtained by first imaging a through-slice FOV about three times larger than the slab-selective excitation, then reformatting the k-space data to image the slab profile shown in the top row. The second row shows averaged line profiles through the slabs. The last row shows the simulated profiles, including real (dashed) and imaginary (dotted) parts, which agree well with the experimental profiles.

Figure 9:
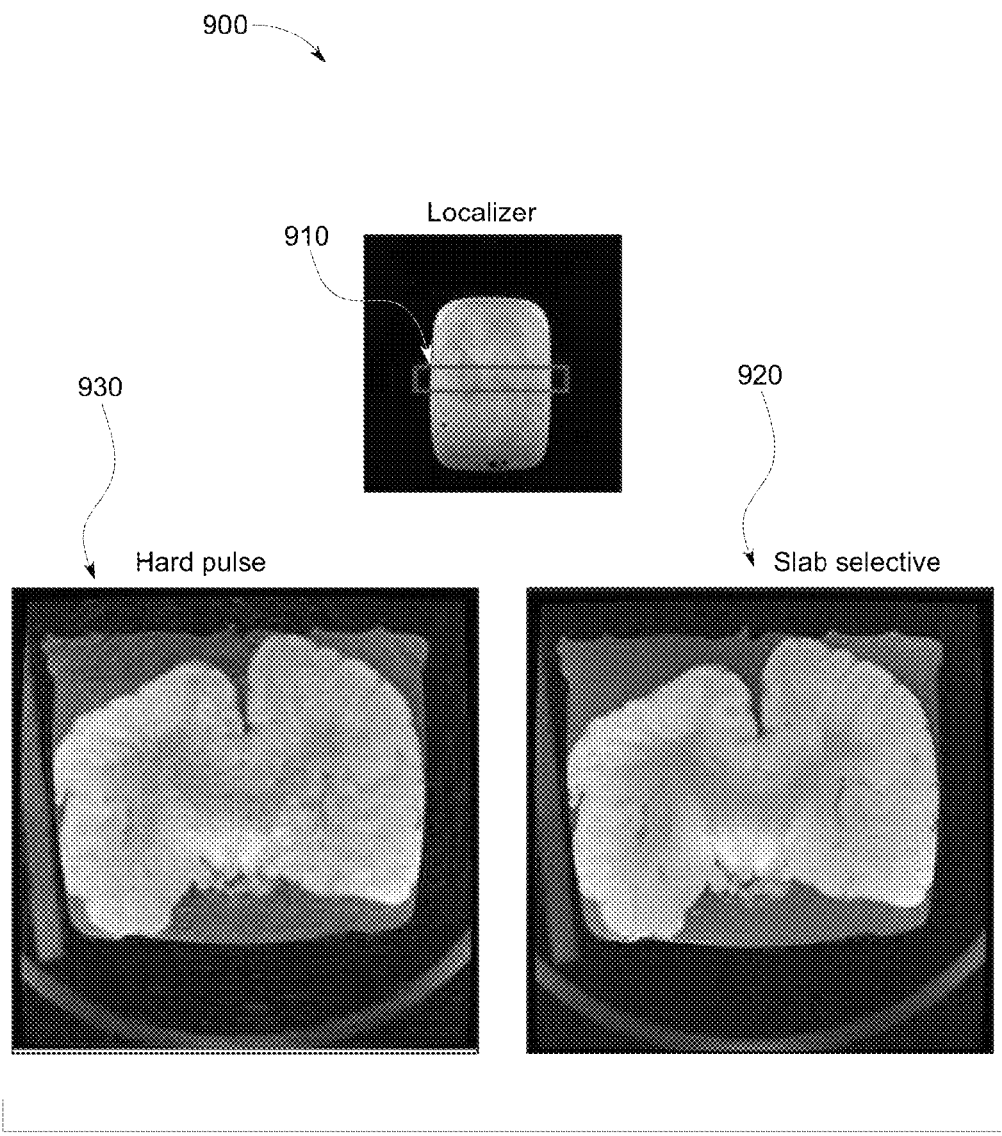
FIG. 9 shows experimental comparison of a conventional scan to the scan shown in FIG. 7.

FIG. 9 shows experimental comparison of a conventional "hard pulse" scan to the scan 700 as shown in FIG. 7, when used for axially imaging an ex-vivo brain. The encoded volume in the slab direction was 10 slices with 2 mm slices thickness (see box 910 on coronal localizer 900 at top of FIG. 9). The slab selective image 920 exhibits no major visible artifacts. The hard pulse excitation image 930, on the other hand, shows through-slice artifacts because the through-slice length of the brain phantom (~20 cm) greatly exceeds the encoded volume in the slab direction (20 mm), causing aliasing artifacts.

Overall, the scan 700 that is shown in FIG. 7, which combines the minor VERSE-corrected SLR excitation pulse 710 with the minimal-duration gradient rewinder 722, provides a somewhat imperfect slab profile that has a non-zero imaginary component with some out-of-slab signal incorporated into the image. However, the out-of-slab signal does not appear to introduce visible artifacts into the final images, while the minimal-duration rewinder 722 advantageously enables significant reduction of TE to less than about 30 μs, which is more than three-fold improvement over the best result obtained using the scan 500 shown in FIG. 5.

Thus, in embodiments, a method is provided for slab selection in ultrashort echo time three-dimensional MRI. The inventive method includes applying an excitation signal to a target under a polarizing field; applying a unipolar slab selection gradient pulse to the target, concurrent with the excitation signal; and applying a rewinder pulse to the target for less than about 30 μs, immediately after the slab selection gradient pulse, and still under the polarizing field. For example, the excitation signal may be a minimum phase SLR pulse. Also, the excitation signal may be VERSE corrected. In certain embodiments, the method may include, after the rewinder pulse, applying gradient pulses to sample an outward spiraling k-space trajectory. The method also may include sampling a k-space trajectory for a slab broader than the slab selection gradient pulse. For example, the method may sample a k-space trajectory for a slab about three times broader than the slab selection gradient pulse. In certain embodiments, the rewinder pulse may be applied immediately after the end of the excitation signal.

In other embodiments, an apparatus is provided for ultrashort echo time three-dimensional MRI. The inventive apparatus includes a magnet assembly and a controller configured to operate the magnet assembly for applying an excitation signal to a target under a polarizing field; applying a unipolar slab selection gradient pulse to the target, concurrent with the excitation signal; and applying a rewinder pulse to the target for less than about 30 μs, immediately after the slab selection gradient pulse, and still under the polarizing field. For example, the excitation signal may be a minimum phase SLR pulse. Also, the excitation signal may be VERSE corrected. In certain embodiments, the method may include, after the rewinder pulse, applying gradient pulses to sample an outward spiraling k-space trajectory. The method also may include sampling a k-space trajectory for a slab broader than the slab selection gradient pulse. For example, the method may sample a k-space trajectory for a slab about three times broader than the slab selection gradient pulse. In certain embodiments, the rewinder pulse may be applied immediately after the end of the excitation signal.

In other embodiments, an article of computer-readable media is encoded with an MRI image obtained by a process that includes applying an excitation signal to a target under a polarizing field; applying a unipolar slab selection gradient pulse to the target, concurrent with the excitation signal; and applying a rewinder pulse to the target for less than about 30 μs, immediately after the slab selection gradient pulse, and still under the polarizing field. For example, the excitation signal may be a minimum phase SLR pulse. Also, the excitation signal may be VERSE corrected. In certain embodiments, the method may include, after the rewinder pulse, applying gradient pulses to sample an outward spiraling k-space trajectory. The method also may include sampling a k-space trajectory for a slab broader than the slab selection gradient pulse. For example, the method may sample a k-space trajectory for a slab about three times broader than the slab selection gradient pulse. In certain embodiments, the rewinder pulse may be applied immediately after the end of the excitation signal.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus, method, and article, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method for slab-selection in ultrashort echo time (UTE) three-dimensional (3D) magnetic resonance imaging (MRI), comprising:
    applying a RF excitation signal to a target under a polarizing magnetic field;
    applying a unipolar slab-selection gradient pulse to the target, concurrent with the RF excitation signal; and
    applying a rewinder gradient pulse to the target for less than about 30 µs, immediately after the unipolar slab-selection gradient pulse, and still under the polarizing magnetic field.

2. The method of claim 1, wherein the RF excitation signal is a minimum phase Shinnar-Le Roux (SLR) pulse.

3. The method of claim 2, wherein the RF excitation signal is Variable Rate Selective Excitation (VERSE) corrected.

4. The method of claim 1, further comprising after the rewinder gradient pulse, applying gradient pulses to generate an outward spiraling k-space trajectory.

5. The method of claim 4, further comprising sampling a k-space trajectory for a slab broader than the slab-selection gradient pulse.

6. The method of claim 5, wherein the k-space trajectory is for a slab about three times broader than the slab-selection gradient pulse.

7. The method of claim 1, wherein the rewinder gradient pulse is applied immediately after the end of the RF excitation signal.

8. An apparatus for ultrashort echo time (UTE) three-dimensional (3D) magnetic resonance imaging (MRI), comprising:
    a magnet assembly; and
    a controller configured to operate the magnet assembly for:
        applying a RF excitation signal to a target under a polarizing magnetic field;
        applying a unipolar slab-selection gradient pulse to the target, concurrent with the RF excitation signal; and
        applying a rewinder gradient pulse to the target for less than about 30 µs, immediately after the unipolar slab-selection gradient pulse, and still under the polarizing magnetic field.

9. The apparatus of claim 8, wherein the RF excitation signal is a minimum phase Shinnar-Le Roux (SLR) pulse.

10. The apparatus of claim 9, wherein the RF excitation signal is Variable Rate Selective Excitation (VERSE) corrected.

11. The apparatus of claim 8, further comprising after the rewinder gradient pulse, applying gradient pulses to generate an outward spiraling k-space trajectory.

12. The apparatus of claim 11, further comprising sampling a k-space trajectory for a slab broader than the slab-selection gradient pulse.

13. The apparatus of claim 12, wherein the k-space trajectory is for a slab about three times broader than the slab-selection gradient pulse.

14. The apparatus of claim 8, wherein the rewinder gradient pulse is applied immediately after the end of the RF excitation signal.

15. An article of computer-readable media encoded with a magnetic resonance (MRI) image obtained by a process comprising:
    applying a RF excitation signal to a target under a polarizing magnetic field;
    applying a unipolar slab-selection gradient pulse to the target, concurrent with the RF excitation signal; and applying a rewinder gradient pulse to the target for less than about 30 µs, immediately after the unipolar slab-selection gradient pulse, and still under the polarizing magnetic field.

16. The article of claim 15, wherein the RF excitation signal is a minimum phase Shinnar-Le Roux (SLR) pulse.

17. The article of claim 16, wherein the RF excitation signal is Variable Rate Selective Excitation (VERSE) corrected.

18. The article of claim 15, further comprising after the rewinder gradient pulse, applying gradient pulses to generate an outward spiraling k-space trajectory.

19. The article of claim 18, further comprising sampling a k-space trajectory for a slab broader than the slab-selection gradient pulse.

20. The article of claim 19, wherein the k-space trajectory is for a slab about three times broader than the slab-selection gradient pulse.

21. The article of claim 15, wherein the rewinder gradient pulse is applied immediately after the end of the RF excitation signal.

* * * * *